(12) United States Patent
Chen

(10) Patent No.: US 12,261,216 B2
(45) Date of Patent: Mar. 25, 2025

(54) NETWORK DEVICE HAVING TRANSISTORS EMPLOYING CHARGE-CARRIER MOBILITY MODULATION TO DRIVE OPERATION BEYOND TRANSITION FREQUENCY

(71) Applicant: Marvell Asia Pte Ltd, Singapore (SG)

(72) Inventor: Ricky Yuan Chen, Newbury Park, CA (US)

(73) Assignee: Marvell Asia Pte Ltd, Singapore (SG)

( * ) Notice: Subject to any disclaimer, the term of this patent is extended or adjusted under 35 U.S.C. 154(b) by 519 days.

(21) Appl. No.: 17/673,847

(22) Filed: Feb. 17, 2022

(65) Prior Publication Data

US 2022/0416066 A1 Dec. 29, 2022

Related U.S. Application Data

(60) Provisional application No. 63/224,291, filed on Jul. 21, 2021, provisional application No. 63/214,661, (Continued)

(51) Int. Cl.
*H01L 29/772* (2006.01)
*H01L 29/10* (2006.01)
(Continued)

(52) U.S. Cl.
CPC ...... *H01L 29/7727* (2013.01); *H01L 29/1095* (2013.01); *H01L 29/66681* (2013.01); *H01L 29/7816* (2013.01)

(58) Field of Classification Search
CPC ............. H01L 29/7727; H01L 29/1095; H01L 29/66681; H01L 29/7816; H01L 29/402; (Continued)

(56) References Cited

U.S. PATENT DOCUMENTS 4,688,061 A 8/1987 Sakaki
5,258,632 A 11/1993 Sawada
(Continued)

OTHER PUBLICATIONS

International Application # PCT/IB2022/051821 Search Report dated Jun. 7, 2022.

*Primary Examiner* — Kyoung Lee
*Assistant Examiner* — Christina A Sylvia
(74) *Attorney, Agent, or Firm* — Meitar Patents Ltd.; Daniel Kligler

(57) ABSTRACT

A network device includes one or more circuit components. The one or more circuit components include a semiconductor substrate, a first device terminal and a second device terminal, a drift region, and a mobility modulator. Both device terminals are coupled to the semiconductor substrate, the second device terminal being spatially separated from the first device terminal. The drift region is disposed on the semiconductor substrate between the first device terminal and the second device terminal, the drift region being configured to allow a flow of charge-carriers between the first device terminal and the second device terminal. The mobility modulator is coupled to the drift region, the mobility modulator being configured to selectively apply a field across the drift region responsive to one or more modulation signals, so as to modulate a mobility of charge-carriers as a function of longitudinal position along the drift region.

22 Claims, 8 Drawing Sheets

Related U.S. Application Data filed on Jun. 24, 2021, provisional application No. 63/214,667, filed on Jun. 24, 2021.

(51) Int. Cl.
  *H01L 29/66* (2006.01)
  *H01L 29/78* (2006.01)
(58) Field of Classification Search
  CPC .. H01L 29/404; H01L 29/7835; H01L 29/861
  See application file for complete search history.

(56) References Cited

U.S. PATENT DOCUMENTS

| | | | |
|---|---|---|---|
| 10,128,228 B1* | 11/2018 | Gao | H01L 29/0649 |
| 10,524,334 B1* | 12/2019 | Price | H05B 45/10 |
| 2009/0140372 A1* | 6/2009 | Hodel | H01L 21/823481 |
| | | | 257/500 |
| 2012/0175679 A1 | 7/2012 | Marino et al. | |
| 2019/0057961 A1* | 2/2019 | Solaro | H01L 29/7816 |
| 2023/0178648 A1* | 6/2023 | Hsiung | H01L 29/7816 |
| | | | 257/335 |

* cited by examiner

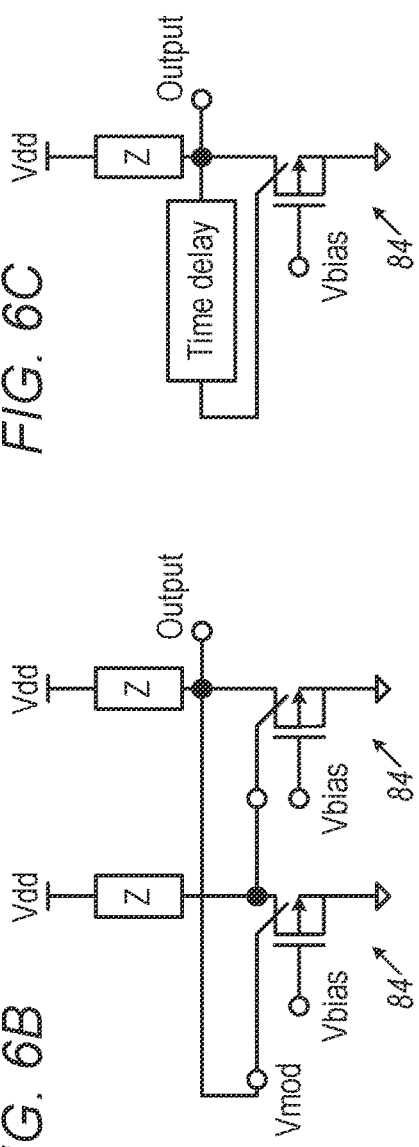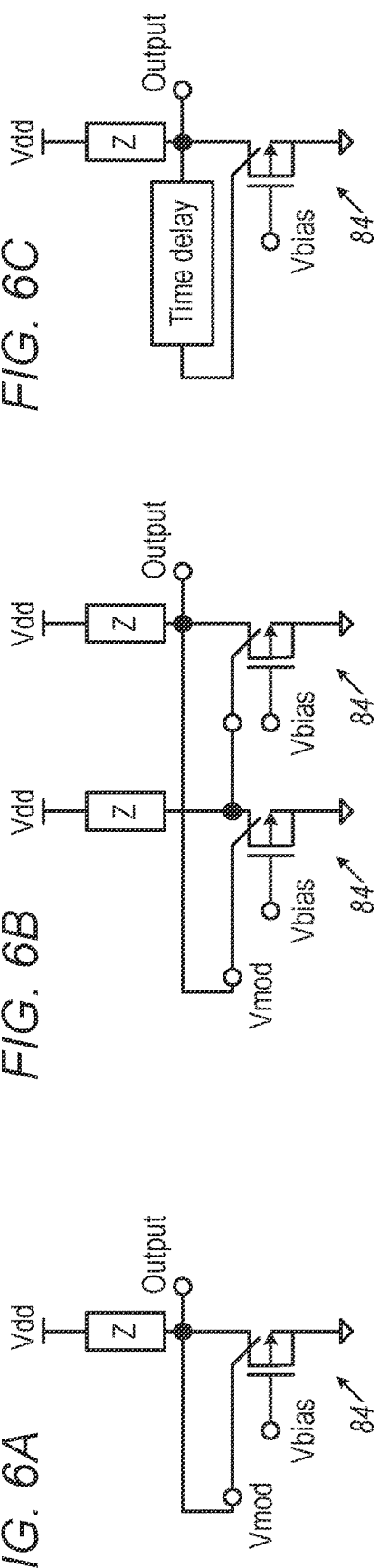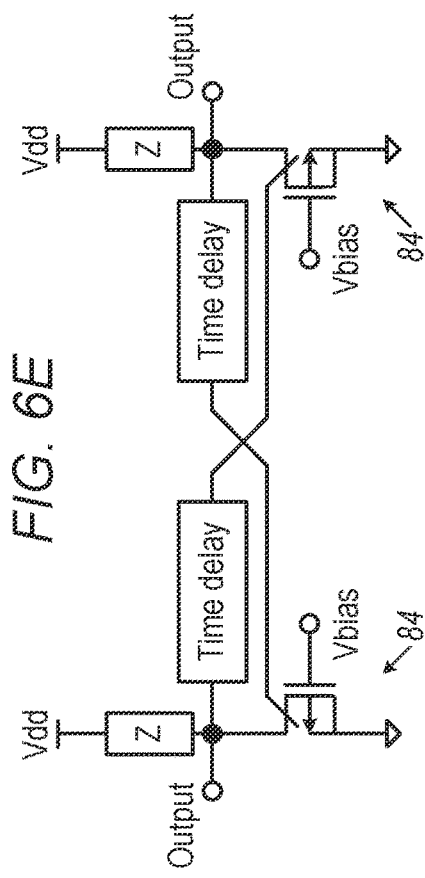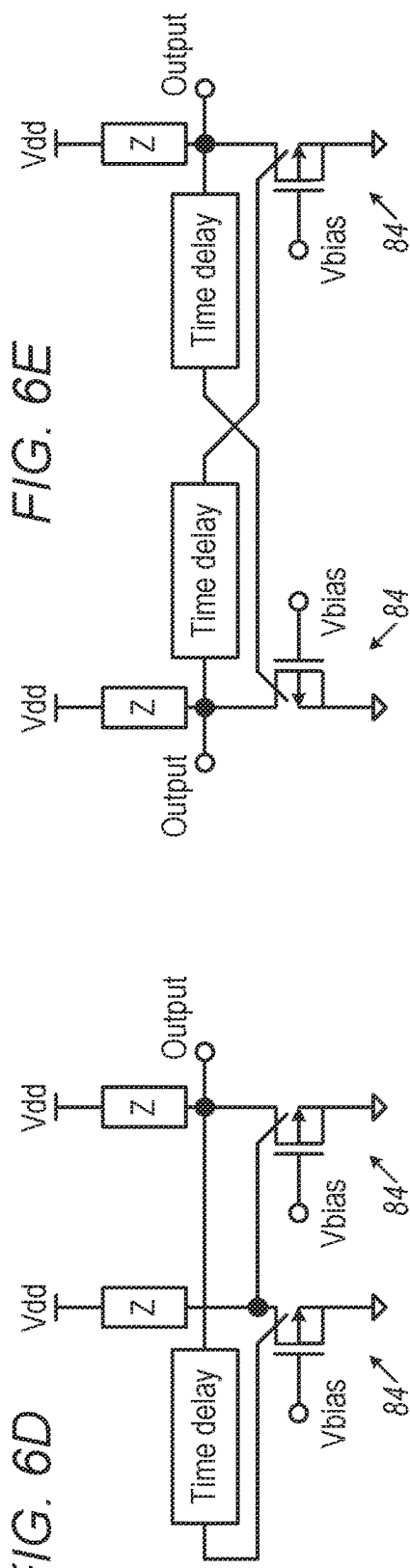

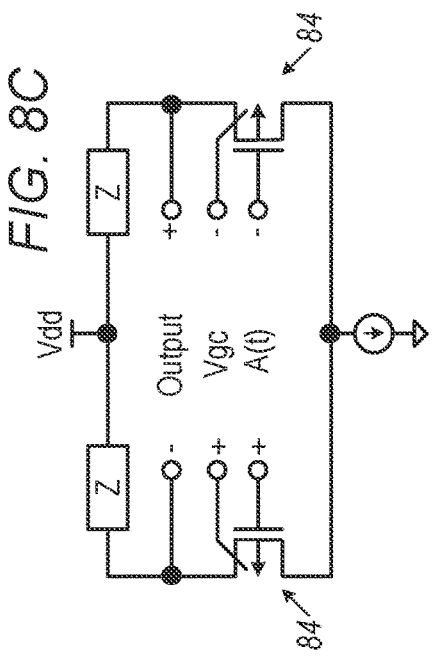
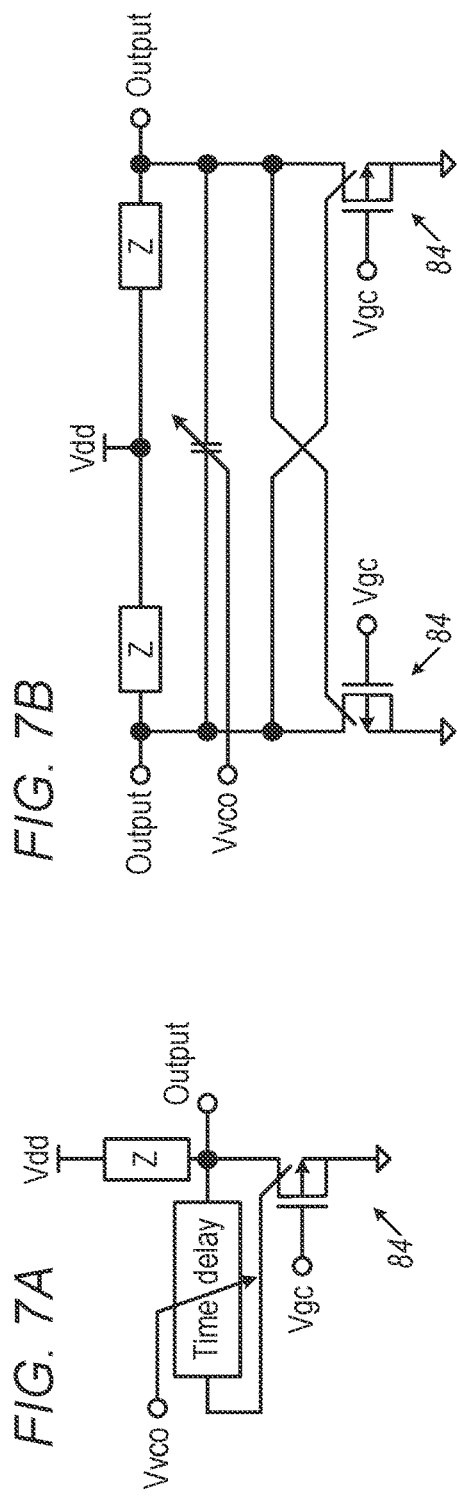
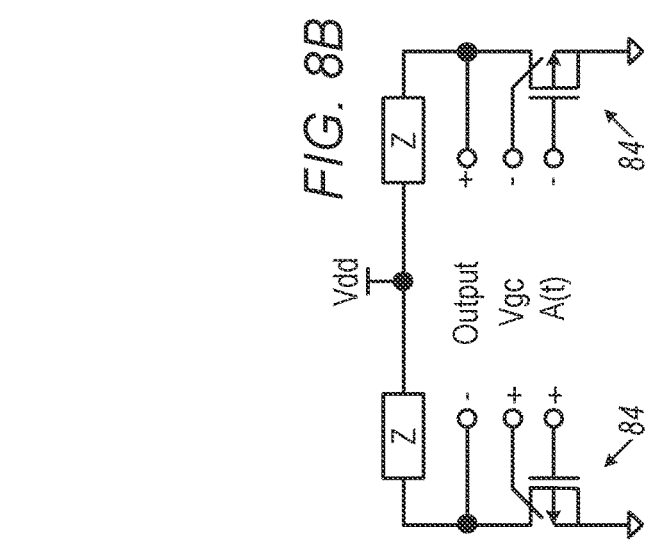
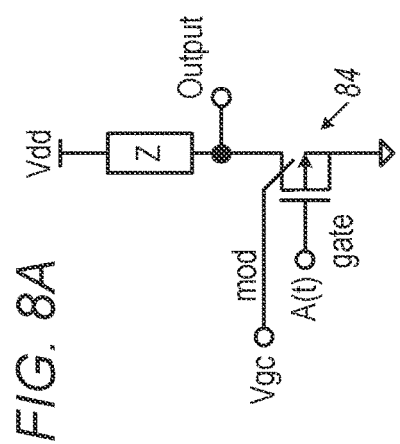
FIG. 7A
FIG. 7B
FIG. 8A
FIG. 8B
FIG. 8C FIG. 14
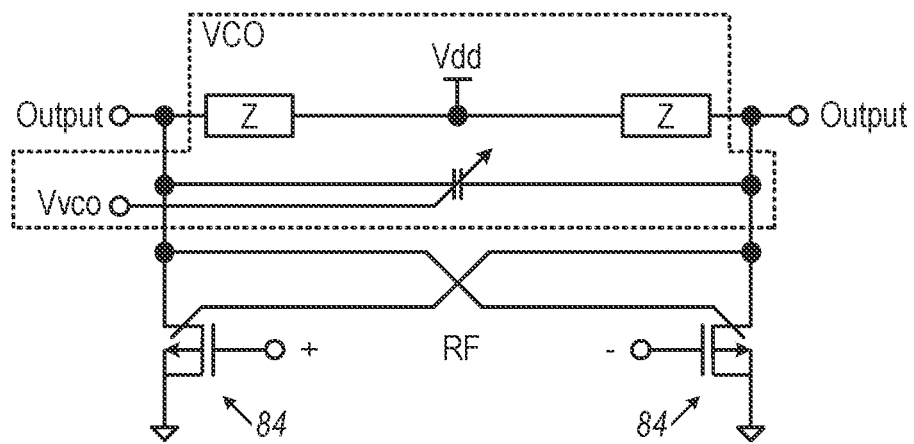
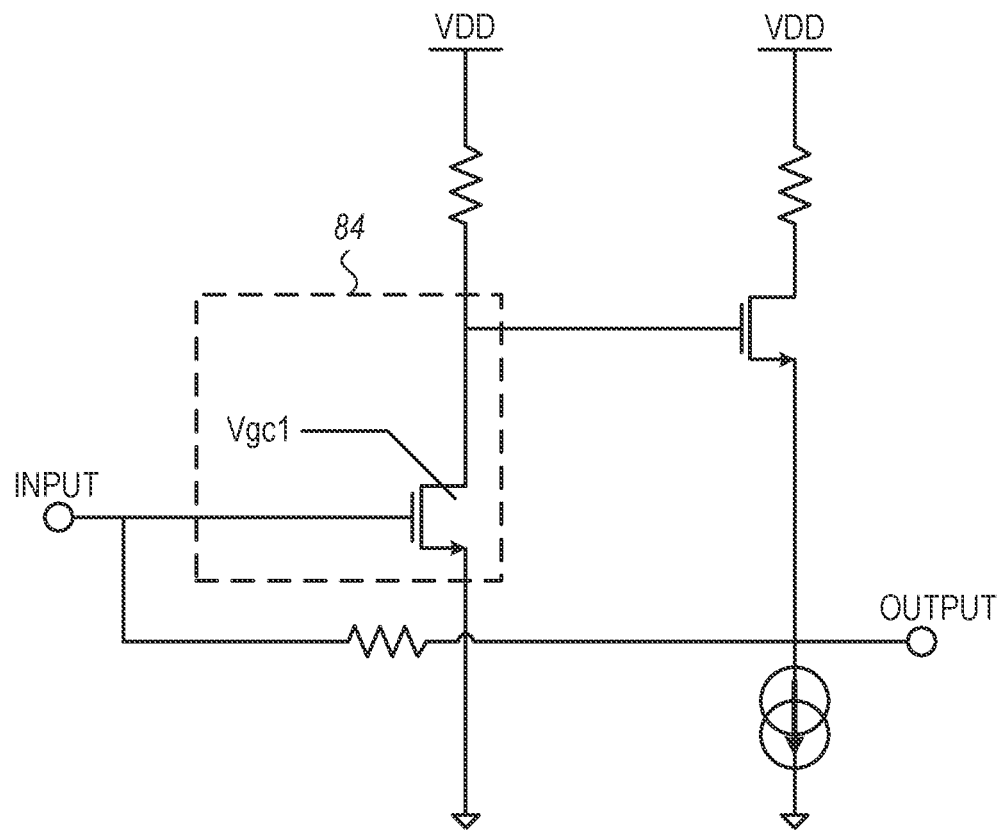
FIG. 15

NETWORK DEVICE HAVING TRANSISTORS EMPLOYING CHARGE-CARRIER MOBILITY MODULATION TO DRIVE OPERATION BEYOND TRANSITION FREQUENCY

CROSS-REFERENCE TO RELATED APPLICATIONS

This application claims the benefit of U.S. Provisional Patent Application 63/214,661, filed Jun. 24, 2021, U.S. Provisional Patent Application 63/214,667, filed Jun. 24, 2021, and U.S. Provisional Patent Application 63/224,291, filed Jul. 21, 2021. The disclosures of these related applications are incorporated herein by reference.

FIELD OF THE DISCLOSURE

The present disclosure relates generally to semiconductor devices, and particularly to semiconductor devices employing charge-carrier mobility modulation.

BACKGROUND

Modulation of the mobility or velocity of charge carriers has been suggested for use in semiconductor devices. For example, U.S. Pat. No. 4,688,061 describes a mobility-modulation Field-Effect Transistor (FET) that utilizes a mobility-modulation system in which the mobility of the carriers within the channel is modulated by a signal voltage applied to gate electrodes. A mobility-modulation system in which the channels are so formed as to vary the carrier mobility in response to the applied gate voltage is utilized, which is different from the carrier density modulation system.

U.S. Pat. No. 5,258,632 describes a velocity modulation transistor having a first barrier layer, first channel layer, second barrier layer, second channel layer, third barrier layer, input/output electrode and control electrode that are laminated on a semi-insulative substrate. The electron affinity of the first channel layer is larger than that of the second channel layer. The energy difference between the first level and the second level can be obtained according to the difference in the electron affinity between the first and second channel layers as well as to the control of the film thickness of the first and second channel layers, whereby the velocity modulation effect at room temperature becomes large.

The description above is presented as a general overview of related art in this field and should not be construed as an admission that any of the information it contains constitutes prior art against the present patent application.

SUMMARY

An embodiment that is described herein provides a network device including one or more circuit components. The one or more circuit components include a semiconductor substrate, a first device terminal and a second device terminal, a drift region, and a mobility modulator. Both device terminals are coupled to the semiconductor substrate, the second device terminal being spatially separated from the first device terminal. The drift region is disposed on the semiconductor substrate between the first device terminal and the second device terminal, the drift region being configured to allow a flow of charge-carriers between the first device terminal and the second device terminal. The mobility modulator is coupled to the drift region, the mobility modulator being configured to selectively apply a field across the drift region responsive to one or more modulation signals, so as to modulate a mobility of charge-carriers as a function of longitudinal position along the drift region.

In some embodiments, the network device further includes one or more modulation terminals configured to supply the one or more modulation signals to the mobility modulator, the one or more modulation terminals being separate from the first device terminal and the second device terminal.

In an embodiment, the mobility modulator is configured to modulate the mobility of the charge-carriers at two or more spatially different positions along the drift region. In a disclosed embodiment, in modulating the mobility, the mobility modulator is configured to set the mobility to first and second different mobilities at respective first and second different positions along the drift region. In an example embodiment, the mobility modulator is configured to modulate the mobility of the charge-carriers by selectively applying one or both of an electric field and a magnetic field to at least part of the drift region. In some embodiments the network device further includes an interface region coupled to the drift region, the mobility modulator configured to modulate the mobility of the charge-carriers by causing a scattering of some charge-carriers that impinge on the interface region.

In a disclosed embodiment, the mobility modulator includes at least one electrode coupled to the drift region, the at least one electrode configured to modulate the mobility by applying at least one electric field to at least one section of the drift region responsively to the one or more modulation signals. In another embodiment, the mobility modulator includes a transmission line coupled to the drift region, the transmission line being configured to modulate the mobility by applying an electromagnetic field to the drift region responsively to the one or more modulation signals.

In some embodiments, the one or more modulation signals include a periodic modulation signal, and the mobility modulator is configured to modulate the mobility of the charge-carriers in accordance with multiple cycles of the periodic modulation signal along the drift region. In some embodiments, the mobility modulator is configured to modulate the mobility of the charge-carriers in accordance with a non-periodic modulation signal.

In an embodiment, the first device terminal is a gate, and the second device terminal is a drain. In another embodiment, the first device terminal is a base, and the second device terminal is a collector. In disclosed embodiments, the circuit components are disposed in one or more sub-circuits of the network device, the sub-circuits including one or more of an oscillator, an amplifier, a mixer, and a multiplier.

There is additionally provided, in accordance with an embodiment that is described herein, a method for producing a circuit component. The method includes coupling a first device terminal and a second device terminal to a semiconductor substrate, the second device terminal being spatially separated from the first device terminal. A drift region is disposed on the semiconductor substrate between the first device terminal and the second device terminal, the drift region being configured to allow a flow of charge-carriers between the first device terminal and the second device terminal. A mobility modulator is coupled to the drift region, the mobility modulator configured to selectively apply a field across the drift region responsive to one or more modulation signals, so as to modulate a mobility of charge-carriers as a function of longitudinal position along the drift region.

There is further provided, in accordance with an embodiment that is described herein, a method of operating a circuit component in a network device, the circuit component including (i) a first device terminal and a second device terminal, both device terminals coupled to a semiconductor substrate, the second device terminal being spatially separated from the first device terminal, (ii) a drift region disposed on the semiconductor substrate between the first device terminal and the second device terminal, and (iii) a mobility modulator coupled to the drift region. The method includes allowing a flow of charge-carriers along the drift region between the first device terminal and the second device terminal. A mobility of the charge-carriers is modulated as a function of longitudinal position along the drift region, by selectively applying a field across the drift region using the mobility modulator responsive to one or more modulation signals.

The present disclosure will be more fully understood from the following detailed description of the embodiments thereof, taken together with the drawings in which:

BRIEF DESCRIPTION OF THE DRAWINGS

FIGS. 6A-6E are schematic circuit diagrams of oscillators comprising transistors that employ charge-carrier mobility modulation, in accordance with embodiments that are described herein;

FIGS. 7A and 7B are schematic circuit diagrams of Voltage-Controlled Oscillators (VCOs) comprising transistors that employ charge-carrier mobility modulation, in accordance with embodiments that are described herein;

FIGS. 8A-8E are schematic circuit diagrams of amplifiers comprising transistors that employ charge-carrier mobility modulation, in accordance with embodiments that are described herein;

FIG. 14 is a schematic circuit diagram of a differential transistor VCO operating as a mixer, comprising transistors that employ charge-carrier mobility modulation, in accordance with an embodiment that are described herein;

FIG. 15 is a schematic circuit diagram of a Low-Noise Amplifier (LNA) or Trans-Impedance Amplifier (TIA), comprising a transistor that employs charge-carrier mobility modulation, in accordance with an embodiment that is described herein.

DETAILED DESCRIPTION OF EMBODIMENTS

Figure 1:
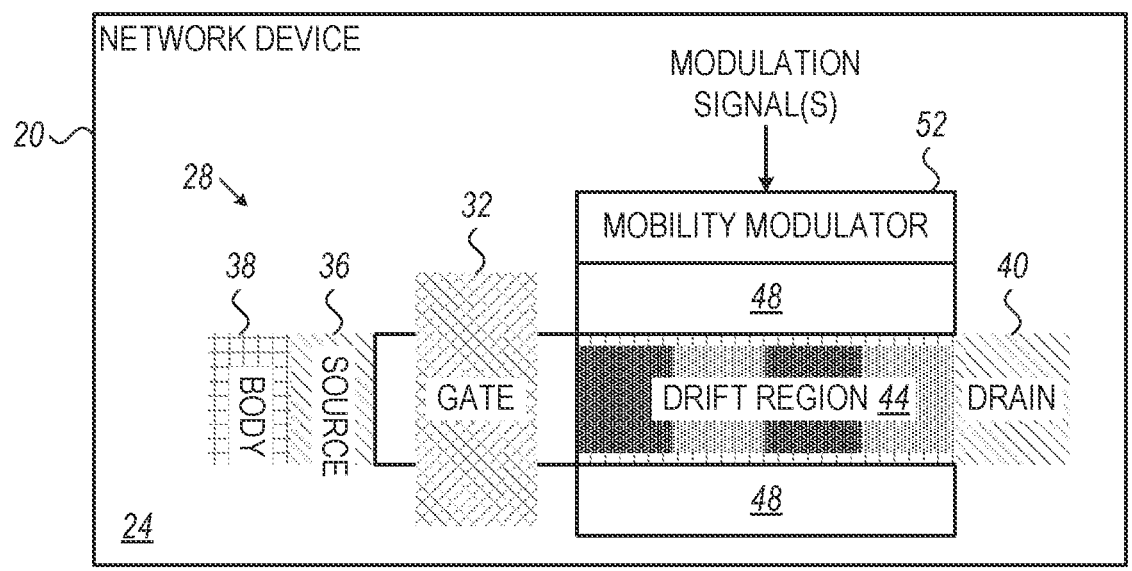
FIG. 1 is a schematic top view of a network device comprising a transistor that employs charge-carrier mobility modulation, in accordance with an embodiment that is described herein.

Embodiments that are described herein provide improved semiconductor components and associated methods, which enable operation at frequencies above the transition frequency (fT) that is characteristic of the component's terminal structure, e.g., gate structure. The embodiments described herein refer mainly to Field-Effect Transistors (FETs), by way of example, but the disclosed techniques are applicable to other suitable types of transistors, such as Bipolar Junction Transistors (BJTs), Junction FETs (JFETs) and Heterojunction Bipolar Transistors (HBTs).

In some embodiments, a FET comprises source, gate and drain terminals (collectively referred to herein as "device terminals") disposed on a semiconductor substrate. The gate and drain are spatially separated from one another, and an elongated drift region is disposed on the semiconductor substrate between them. The drift region allows a flow of charge-carriers (electrons or holes) between the gate and drain. In an alternative embodiment, in a BJT, the drift region is disposed on the semiconductor substrate between the base and the collector.

The disclosed FET further comprises a mobility modulator that is coupled to the drift region. The mobility modulator is configured to selectively apply an alternating (time-variable, "AC") field (electric, magnetic or electromagnetic in various embodiments) across the drift region responsively to one or more modulation signals. The alternating field modulates the mobility of charge-carriers as a function of longitudinal position along the drift region. In other words, as charge-carriers travel between the gate and the drain along the drift region, their drift velocity changes depending on their position along the drift region.

In one example implementation, the FET comprises a modulation terminal for supplying a modulation signal to the mobility modulator. The modulation signal has a frequency that is above the transition frequency fT of the FET, for example twice or 1.5 times the transition frequency. The modulation signal may be a sinusoidal signal, or it may have any other suitable waveform, e.g., a square wave, a pulsed signal or any other.

By modulating the charge-carrier mobility, the mobility modulator causes the spatial density of charge-carriers to vary periodically as a function of longitudinal position along the drift region. Typically, the drift region captures multiple periods of modulated mobility (and thus charge-density).

When the charge-carrier density is modulated across a drift region in the manner described herein, the modulation frequency is not limited by the properties of the gate structure, e.g., transit time and gate parasitic capacitances.

Therefore, the disclosed FET is capable of operating (e.g., oscillating, switching or amplifying signals) at frequencies that are considerably above its transition frequency.

The increase in operating frequency can be exploited in various ways. For example, faster transistor switching rates can be achieved for a given process technology. As another example, transistor switching at a prescribed rate can be achieved using simpler and lower-cost process nodes. In some embodiments, different transistors within a given device can be set to different operating frequencies as needed.

Various implementation examples of FETs, in accordance with the disclosed techniques, are described in detail herein. Also described herein are various use-cases, i.e., types of electronic circuits that can be implemented using the disclosed components. Example use-cases include oscillators, amplifiers, mixers and multipliers. Such components can be used as building blocks of electronic devices such as Phase-Locked Loops (PLLs), Serializer-Deserializer (SerDes) devices, optical transceivers, harmonic generators, and many others. The embodiments described herein refer mainly to communication devices, e.g., as used in network devices. The disclosed techniques, however, are useful in a wide variety of electronic systems.

FIG. 1 is a schematic top view of a network device 20, in accordance with an embodiment that is described herein. Network device 20 may comprise, for example, an Ethernet packet switch or any other suitable device used for network communication. Network device 20 comprises a semiconductor substrate 24, and various electronic circuit components disposed on substrate 24. The circuit components comprise, inter alia, a FET 28. In the present example, substrate 24 is a silicon substrate, and FET 28 is a Metal-Oxide Semiconductor (MOS) FET. Examples relating to both Negative MOS (NMOS) and Positive MOS (PMOS) FETs are given below.

FET 28 comprises a gate 32, a source 36, a body connection 38 and a drain 40, all disposed on substrate 24. Gate 32, source 36 and drain 40 are also referred to collectively as "device terminals". FET 28 further comprises a drift region 44, which is disposed on substrate 24 between gate 32 and drain 40. Boundary regions 48 are disposed on either side of drift region 44. Boundary regions 48 may comprise, for example, Shallow Trench Isolation (STI) regions, a suitable oxide region, the bulk interface to substrate 24, or any other suitable type of boundary region.

In some embodiments, FET 28 further comprises a mobility modulator 52 coupled to drift region 44. Mobility modulator 52 is provided with one or more modulation signals, and modulates the charge-carrier mobility across drift region 44 in response to the modulation signals. Techniques for charge-carrier modulation using electric, magnetic or electromagnetic (EM) fields, in various embodiments, are described below.

The modulation of the charge-carrier mobility, in turn, modulates the charge-carrier density as a function of longitudinal position along drift region 44. (In the present context, the axis connecting gate 32 and drain 40 is regarded as the longitudinal axis of the drift region.) One mechanism that accounts for this effect is scattering of charge-carriers that impinge on the interface between drift region 44 and regions 48. Another mechanism that may account for this effect, albeit to a much lesser extent, is electron-phonon scattering. Typically, the extent of charge-carrier scattering at this interface depends on the electric field orthogonal (perpendicular) to this interface.

Therefore, modulating the charge-carrier mobility in time, at a specific point or points along the drift region, causes a corresponding modulation of the space charge density. As a result, FET 28 is capable of operating considerably above its transition frequency fT, by decoupling dependencies of the operating frequency on transit time.

In the present context, the transition frequency fT is defined as the frequency at which the small-signal current gain from the input gate to the output drain of the transistor is unity. Below fT the transistor provides positive gain. Above fT the transistor practically attenuates input signals. In the present context, the term "charge-carrier mobility" (or simply "mobility") is defined as $\mu=v_d/E$, wherein $v_d$ denotes the drift velocity of charge carriers in response to an electric field E (in the example of FIG. 1, the electric field between gate 32 and drain 40).

In the embodiments described herein, drift region 44 is disposed between gate 32 and drain 40. In alternative embodiments it may be possible to implement a transistor with drift region 44 disposed between source 36 and gate 32.

FIGS. 2-5 below illustrate examples of transistors that comprise various implementations of mobility modulator 52. Any of these transistor configurations can be used for implementing transistor 28 of FIG. 1.

Figure 2:
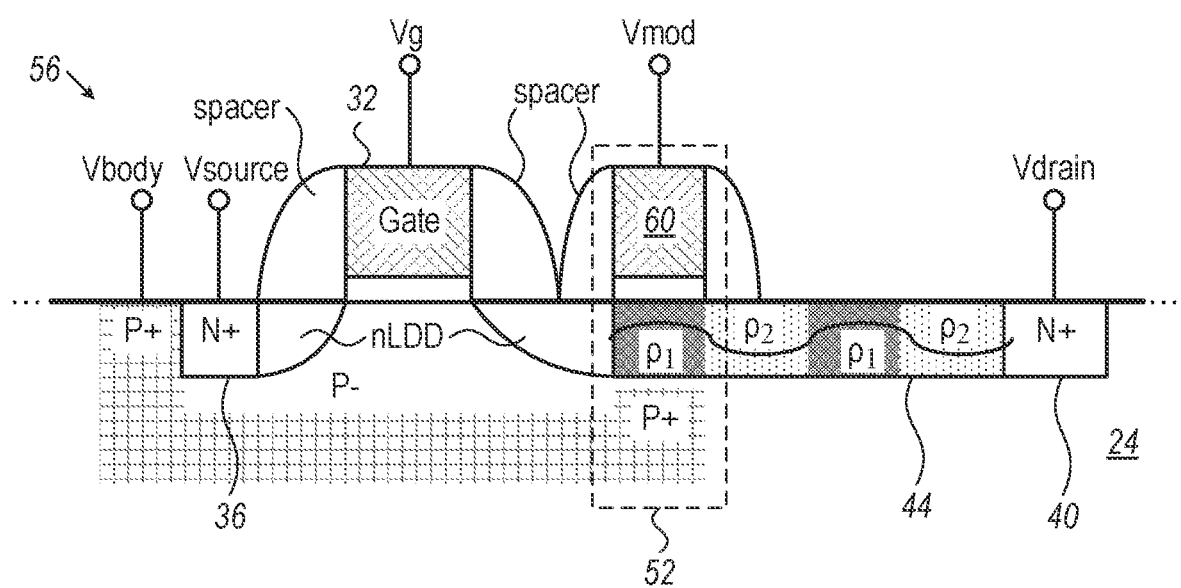
FIGS. 2-4 are schematic side cross-sections of transistors that employ charge-carrier mobility modulation, in accordance with embodiments that are described herein.

FIG. 2 is a schematic side cross-section of a transistor 56 that employs charge-carrier mobility modulation, in accordance with an embodiment that is described herein. In the present example, transistor 56 is an NMOS FET.

The left-hand side of the figure shows a body electrode (denoted Vbody), coupled to a heavily doped positive (P+) region. A source terminal (denoted Vsource) is connected to a heavily doped negative (N+) source 36. A gate terminal (denoted Vg) is connected to gate 32. A drain terminal (denoted Vdrain) is connected to a heavily doped negative (N+) drain 40. Drift region 44 is disposed between gate 32 and drain 40. Negative lightly doped diffusion (nLDD) regions connect gate 32 to source 36 and to drift region 44. In various embodiments, the negative doping of drift region 44 can be set to any suitable level, e.g., aiming to optimize the trade-off between high drain conductance and best charge density modulation.

In the example of FIG. 2, mobility modulator 52 modulates the charge-carrier mobility by applying an electric field across a selected section of drift region 44. For this purpose, mobility modulator 52 comprises (i) a modulation electrode 60 and (ii) a continuation of the P+ region. In the present example, spacers are disposed on substrate 24, on either side of gate 32 and on either side of modulation electrode 60.

A modulation signal (denoted Vmod) is connected to modulation electrode 60 is supplied with a modulation signal that creates an alternating electric field between electrode 60 and the P+ continuation. In one embodiment, the modulation signal is sinusoidal. In alternative embodiments, however, the modulation signal may have any suitable waveform. Some non-limiting examples of non-sinusoidal modulation-signal waveforms include square-wave waveforms, pre-distortion waveforms to compensate for non-linearity of the Vmod-to-Vdrain transfer function, pulse non-periodic waveforms, chirp (also referred to as "linear FM") waveforms as used in radar applications, and many others. The description that follows will refer to periodic, e.g., sinusoidal, waveforms for the sake of clarity.

The electric field causes the mobility (and thus the spatial density) of charge-carriers to vary periodically as a function of longitudinal position along drift region 44. This variation is illustrated by a sinusoidal waveform in the figure. As noted above, the axis connecting gate 32 and drain 40 is regarded as the longitudinal axis of the drift region. As seen, the charge-carrier density oscillates along this axis of drift region 44 between a maximal density denoted $\rho_1$ and a minimal density denoted $\rho_2$. At a given time, the drift region spans multiple periods of the charge-carrier density variations. This undulating space charge density traverses across drift region 44 and deliver modulated current to drain terminal 40.

Figure 3:
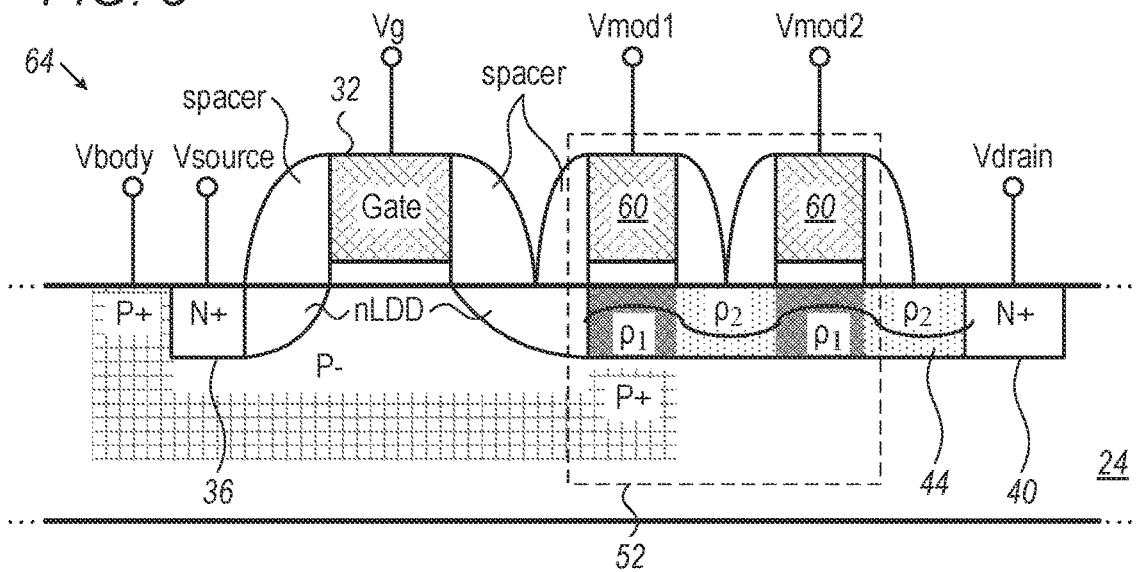

FIG. 3 is a schematic side cross-section of a transistor 64 that employs charge-carrier mobility modulation, in accordance with an alternative embodiment that are described herein. Like transistor 56 of FIG. 2, mobility modulator 52 modulates the charge-carrier mobility by applying an electric field. In transistor 64, however, mobility modulator 52 comprises two modulation electrodes 60 instead of a single electrode. With this configuration, mobility modulator 52 is configured to modulate the charge-carrier mobility at two different positions along drift region 44.

In one embodiment (seen in the figure), transistor 64 comprises two modulation terminals (denoted Vmod1 and Vmod2) that provide two separate modulation signals to the two modulation electrodes 60, respectively. In an alternative embodiment, a single modulation terminal may be used to supply a single modulation signal to both modulation electrodes 60.

In some embodiments, modulation electrodes 60 are spaced to coincide with the peaks of the charge density corresponding to the intended operating frequency. This spacing constructively re-enforces the charge density modulation, and therefore improves Vmod-to-drain current sensitivity. In alternative embodiments, any other suitable spacing can be used.

In the embodiment of FIG. 3, transistor 64 comprises two modulation electrodes 60. In alternative embodiments, any suitable larger number of modulation electrodes can be used.

Figure 4:
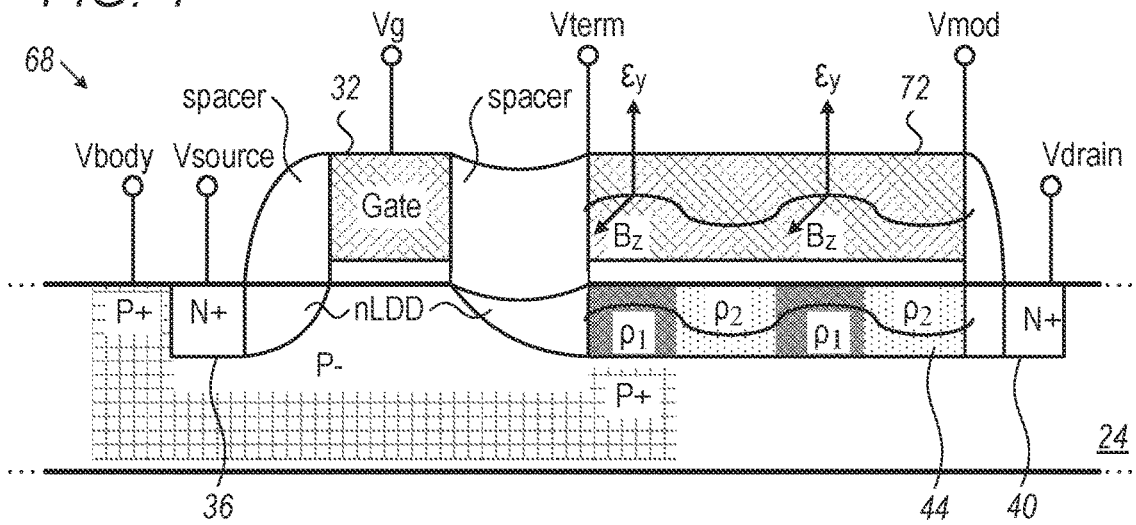

FIG. 4 is a schematic side cross-section of a transistor 68 that employs charge-carrier mobility modulation, in accordance with another embodiment that are described herein. In this example, mobility modulator 52 modulates the charge-carrier mobility by applying an electromagnetic (EM) field across drift region 44. For this purpose, mobility modulator 52 comprises a transmission line 72 that is coupled to drift region 44. A modulation signal is applied between a modulation terminal (denoted Vmod) and a termination terminal (denoted Vterm). In response to the modulation signal, transmission line 72 generates an alternating EM field across drift region 44. The EM field comprises an alternating electric component denoted $\varepsilon_y$, and an alternating magnetic component denoted $B_z$, which are mutually orthogonal. In an alternative embodiment, Vmod and Vterm terminals can be exchanged (swapped).

Figure 5:
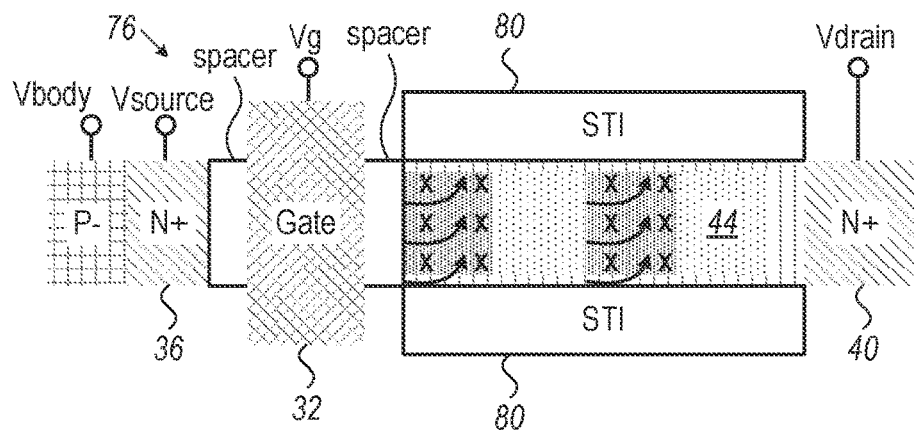
FIG. 5 is a schematic top view of a transistor that employs charge-carrier mobility modulation, in accordance with another embodiment that is described herein.

FIG. 5 is a schematic top view of a transistor 76 that employs charge-carrier mobility modulation, in accordance with yet another embodiment that is described herein. In the present embodiment, mobility modulator 52 modulates the charge-carrier mobility by applying a magnetic field across drift region 44. The magnetic field is perpendicular to the plane of the figure. In the present example the magnetic field is marked with "X" marks in the figure, denoting field lines that enter the plane of the figure.

Alternatively, the magnetic field may be applied in the opposite direction, i.e., with field lines that exit the plane of the figure. Further alternatively, the direction of the magnetic field need not necessarily be orthogonal to the plane of the figure, as long as at least a component of the magnetic field is orthogonal to the plane of the figure.

In an embodiment, for generating such a magnetic field, mobility modulator 52 (not seen in FIG. 5) may comprise coils that are located on either side of drift region 44 (above and below the plane of the figure). Flowing an alternating modulation signal in the coils would generate the desired magnetic field through drift region 44.

The magnetic field causes charge-carriers to impinge on, and scatter from, the boundary regions that borders on drift region 44. In the present example the boundary regions comprise Shallow Trench Isolation (STI) regions 80. Alternatively, any other suitable boundary regions can be used. The charge-carrier drift trajectory, as caused by the magnetic field, is marked with curved arrows inside drift region 44.

The transistor configurations depicted in FIGS. 1-5 are example configurations that are chosen solely for the sake of conceptual clarity. In alternative embodiments, any other suitable configuration can be used. For example, the configurations of FIGS. 2-5 refer to NMOS FETs, by way of example. In alternative embodiments, PMOS FETs can be implemented using similar configurations, with opposite doping polarities for the various transistor elements (i.e., replacing "N+" with "P+" and vice versa).

In various embodiments, the disclosed transistors may have various suitable dimensions and may be fabricated using various suitable process technologies. For example, depending on the process nodes, the operating frequency can reach beyond 300 GHz for 28 nm CMOS, the drift region 44 could be on the order of fractional microns to microns, and the gate channel length can be as small as 3 nm. The gate length and width are a design choice, based on circuit needs, and can range anywhere from 28 nm to mm. The drain, source and body connection can be about ~28 nm in size. The STI region could be on the order of 100 nm or wider. All the above numerical values and ranges are given purely by way of example. In alternative embodiments, any other suitable values and ranges can be used.

In various embodiments, the disclosed transistors can be used for implementing various types of circuit components. The description that follows addresses several example use-cases, including oscillators, amplifiers, mixers and multipliers. Additional details, as well as devices that can be constructed from such circuit components (e.g., PLLs, SerDes devices and optical transceivers) are described in U.S. Provisional Patent Applications 63/214,661, 63/214, 667 and 63/224,291, cited above and incorporated herein by reference.

The description and figures below refer to various devices implemented using one or more transistors 84 that employ charge-carrier mobility modulation, in accordance with embodiments that are described herein. Any of the transistors 84 in the figures below can be implemented using any of the disclosed configurations, e.g., the configurations described in FIGS. 1-5. In all the following figures, the modulation terminal Vmod is denoted by a diagonal line entering the drain of transistor 84.

FIGS. 6A-6E are schematic circuit diagrams of oscillators comprising transistors 84 that employ charge-carrier mobility modulation, in accordance with embodiments that are described herein. By operating above fT, oscillators implemented using a given process node can achieve higher oscillation frequencies. Alternatively, a given oscillation frequency can be achieved using simpler, lower-cost process nodes.

FIG. 6A illustrates an oscillator comprising a single transistor 84. The oscillator comprises a feedback path from the drain to the modulation terminal of transistor 84. The oscillation frequency of the oscillator is determined by the delay of this feedback path, in which the delay of drift region 44 is dominant. In the present example, the source of transistor 84 is connected to ground, and the drain of transistor 84 is connected to the supply voltage Vdd via an impedance component Z. The oscillator output is taken from the transistor drain.

In various embodiments, the impedance component Z may have a resistive, inductive, capacitive, and/or frequency-selective impedance. The impedance component Z may comprise, for example, a resistor, a filter, a resonator, a crystal, an LC resonant tank, a transmission line, or any other suitable component or circuit.

The gate of transistor 84 in this example is biased with a voltage denoted Vbias. In some embodiments Vbias is varied, for example to control the oscillation amplitude or as a gain control to facilitate Adaptive Gain Control (AGC).

FIG. 6B illustrates an oscillator comprising two or more cascaded transistors 84. The present example shows two transistors, but any other suitable number of transistors can be cascaded in a similar manner in alternative embodiments. The transistors are cascaded drain-to-modulation electrode (i.e., the drain of a transistor in the cascade is connected to the modulation electrode of the next transistor in the cascade). The feedback path extends from the drain of the last transistor in the cascade to the modulation terminal of the first transistor in the cascade. The output is taken from the drain of the last transistor in the cascade.

In comparison with the single-transistor scheme of FIG. 6A, the multi-transistor scheme of FIG. 6B is capable of providing higher loop gain and longer time delay. In this scheme, too, Vbias can be varied to control the oscillator amplitude or to enable AGC. The impedance components Z are similar to those of FIG. 6A.

FIG. 6C illustrates another single-transistor oscillator. The scheme of FIG. 6C differs from that of FIG. 6A in that a time-delay element is inserted in the oscillator's feedback path. The time-delay element may be a frequency-selective component or circuit, e.g., a resonant tank, a transmission line of a bandpass filter, for example. Inserting an additional time-delay element enables a longer loop delay, beyond the delay facilitated by the delay of drift region 44.

By the same token, FIG. 6D illustrates a multi-transistor oscillator, which differs from the multi-transistor oscillator of FIG. 6B in that a time-delay element is inserted in the oscillator's feedback path. Similar design considerations apply to the multi-transistor design, as well.

FIG. 6E illustrates an oscillator comprising two transistors 84, for providing a differential output.

FIGS. 7A and 7B are schematic circuit diagrams of Voltage-Controlled Oscillators (VCOs) comprising transistors 84 that employ charge-carrier mobility modulation, in accordance with embodiments that are described herein. FIG. 7A shows a single-transistor VCO providing a single-ended output. FIG. 7B shows a dual-transistor VCO providing a differential output. By operating above fT, the disclosed VCOs can achieve high oscillation frequencies using a given process node. Alternatively, a given oscillation frequency can be achieved by simpler, lower-cost process nodes.

In FIG. 7A, the oscillation frequency is controlled by varying the delay of a delay element in the feedback path in response to a control voltage denoted Vvco. In FIG. 7B, the oscillation frequency is controlled by varying the capacitance of a variable capacitor in response to Vvco. The variable vcapacitor may comprise, for example, a varactor, a mechanically-variable capacitor, a piezoelectric transducer, or any other suitable component or circuit having variable capacitance.

In some embodiments, the gate voltage Vgc is varied, for example to control the oscillation amplitude or as a gain control to facilitate Adaptive Gain Control (AGC).

FIGS. 8A-8E are schematic circuit diagrams of amplifiers comprising transistors 84 that employ charge-carrier mobility modulation, in accordance with embodiments that are described herein. By operating above fT, an amplifier implemented using a given process node can amplify higher frequency signals.

Alternatively, signals of a given frequency can be amplified using amplifiers that use simpler, lower-cost process nodes. In some implementations the modulation signal is used for gain control.

FIG. 8A illustrates a common-source amplifier with AGC. The input signal, denoted A(t), is provided to the gate of transistor 84. The gain control voltage Vgc is provided to the transistor modulation terminal. The amplifier output signal is taken from the drain of transistor 84. The amplifier gain is given by gm·k·Vgc·Z, wherein gm denotes the transistor transconductance, and k denotes the transistor proportionality constant (the ratio between Vgc and the drain current Id).

In an embodiment, a source degenerating impedance component or network can be inserted between the source of transistor 84 and ground. The transistor body can then be connected to ground or to the source.

FIG. 8B illustrates a differential amplifier with AGC. FIG. 8C illustrates a differential-pair amplifier with AGC. These amplifier designs can also be used to implement limiting amplifiers with AGC. In both embodiments, the transistor bodies can then be connected to ground or to the source.

Figure 8D:
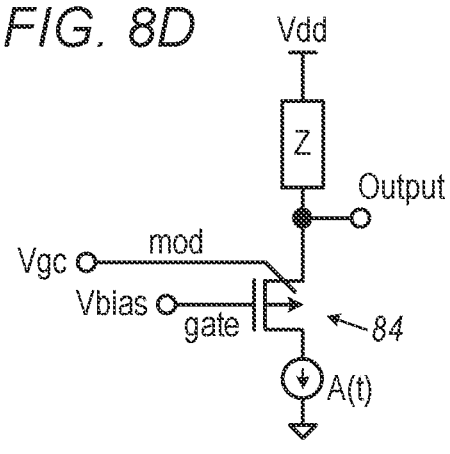

FIG. 8D illustrates a common-gate amplifier with AGC. The amplifier gain is given by k·Vgc·Z. The present example shows a single-ended amplifier, but a differential common-gate amplifier can also be designed in a similar manner. The transistor body can be connected to ground or to the source.

Figure 8E:
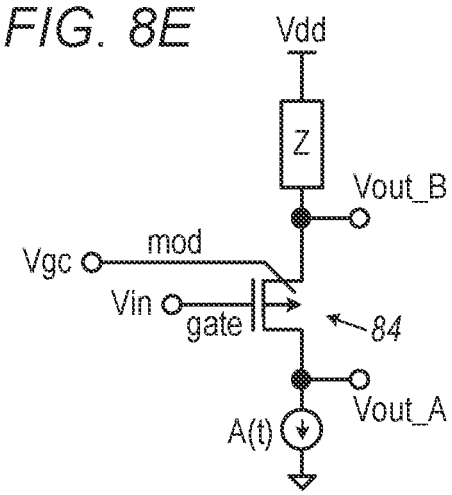

FIG. 8E illustrates a common-drain amplifier with AGC. In addition to the source follower output Vout_A, gain controlled output Vout_B is achieved by varying Vgc on the Vmod terminal of transistor 84. In this embodiment, too, the figure shows a single-ended amplifier, but a differential common-gate amplifier can also be designed in a similar manner. The transistor body can be connected to ground or to the source.

Figure 9A:
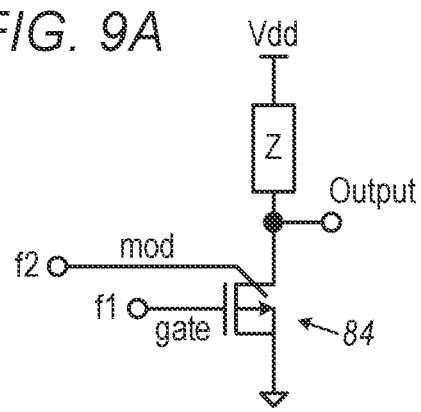
FIGS. 9A and 9B are schematic circuit diagrams of mixers comprising transistors that employ charge-carrier mobility modulation, in accordance with embodiments that are described herein.
Figure 9B:
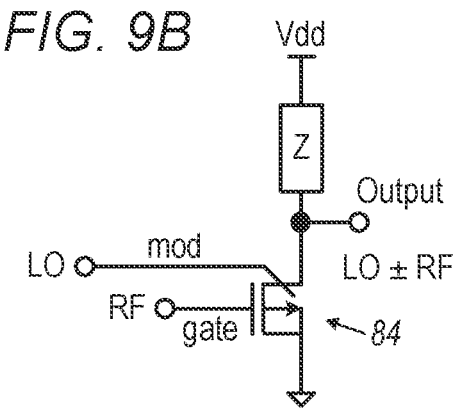

FIGS. 9A and 9B are schematic circuit diagrams of mixers comprising transistors 84 that employ charge-carrier mobility modulation, in accordance with embodiments that are described herein. Both mixers are single-transistor mixers.

The mixer of FIG. 9A mixes two input signals (denoted f1 and f2) applied to the transistor gate and modulation terminal, respectively. The output signal is taken from the transistor drain. F1 would operate under the contraint of fT, while F2 may operate beyond fT.

The mixer of FIG. 9B (which can be viewed as a special case of the mixer of FIG. 9A) mixes a Radio Frequency (RF) signal with a Local Oscillator (LO) signal. In the present example the LO signal has a higher frequency than the RF signal. In the present embodiment the RF signal is applied to the transistor gate, and the LO signal is applied to the transistor modulation terminal. Alternatively, the LO and REF ports may be swapped, i.e., the RF signal can be applied to the modulation electrode and the LO signal can be applied to the gate. The output signal is taken from the transistor drain.

Figure 10:
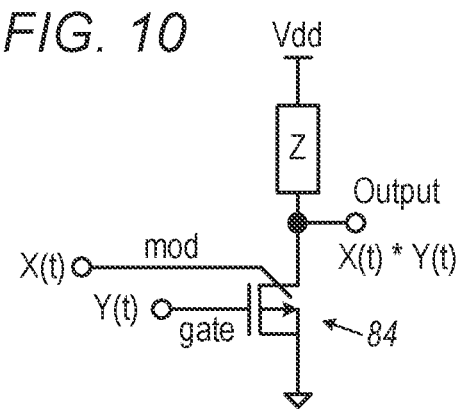
FIG. 10 is a schematic circuit diagram of a multiplier comprising a transistor that employs charge-carrier mobility modulation, in accordance with an embodiment that is described herein.

FIG. 10 is a schematic circuit diagram of a single-transistor multiplier comprising a transistor 84 that employs charge-carrier mobility modulation, in accordance with an embodiment that is described herein. The multiplier multiplies two signals denoted X(t) and Y(t), which are applied to the modulation electrode and to the gate, respectively. The multiplier output is taken from the drain. If the amplitudes of the input signals are small enough to fall in the linear range of transistor 84, the multiplier can be used as a linear multiplier.

Figure 11:
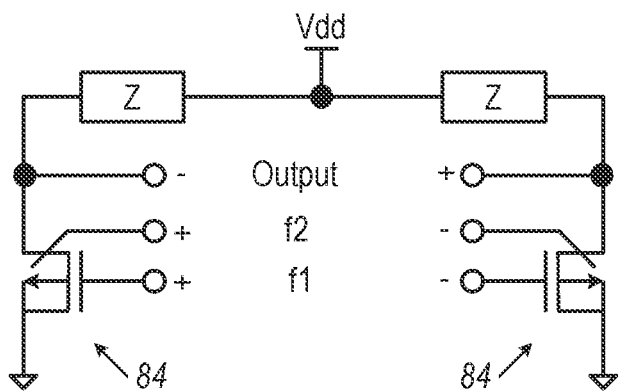
FIG. 11 is a schematic circuit diagram of a differential mixer comprising transistors that employ charge-carrier mobility modulation, in accordance with an embodiment that is described herein.

FIG. 11 is a schematic circuit diagram of a differential mixer comprising transistors 84 that employ charge-carrier mobility modulation, in accordance with an embodiment that is described herein. The mixer mixes two differential input signals (denoted f1 and f2) applied to the transistor gates and modulation terminals, respectively. The output signal is taken from the transistor drains.

Figure 12:
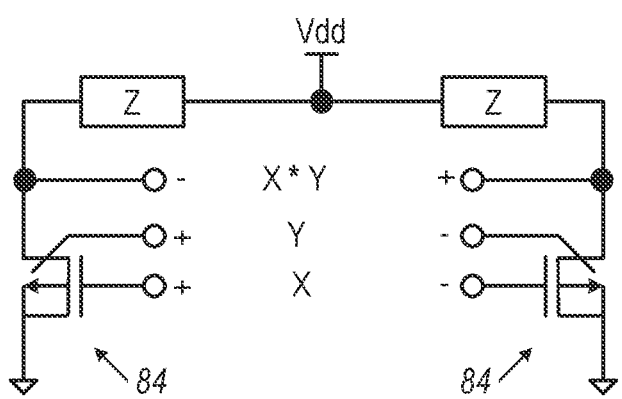
FIG. 12 is a schematic circuit diagram of a differential linear multiplier, comprising transistors that employ charge-carrier mobility modulation, in accordance with an embodiment that is described herein.

FIG. 12 is a schematic circuit diagram of a differential linear multiplier, comprising transistors 84 that employ charge-carrier mobility modulation, in accordance with an embodiment that is described herein. The scheme is similar to that of FIG. 11, but in the present case the amplitudes of the input signals (denoted X, Y) are small enough to fall in the linear ranges of transistors 84, in which case the output is given by X·Y.

Figure 13A:
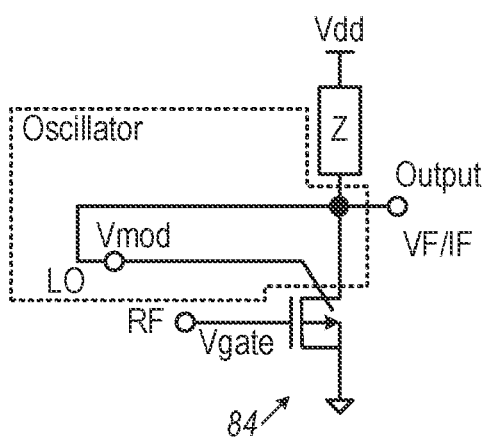
FIGS. 13A and 13B are schematic circuit diagrams of mixers having self-contained Local Oscillators (LOs), comprising transistors that employ charge-carrier mobility modulation, in accordance with embodiments that are described herein.
Figure 13B:
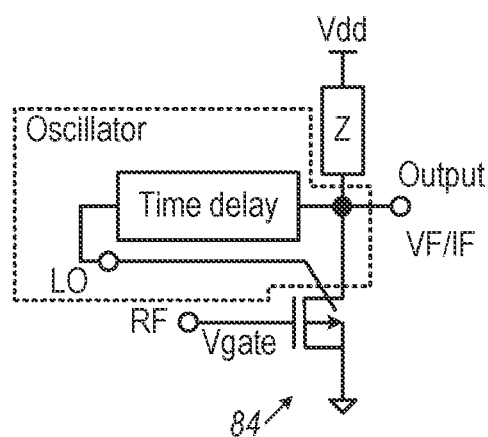

FIGS. 13A and 13B are schematic circuit diagrams of single-transistor mixers having self-contained Local Oscillators (LOs), comprising transistors 84 that employ charge-carrier mobility modulation, in accordance with embodiments that are described herein. In these examples, transistor 84 is configured to operate as an oscillator. An RF signal is applied to the transistor gate. An LO signal is generated internally and applied to the transistor modulation terminal. The output, at a Video Frequency (VF) or Intermediate Frequency (IF), is taken from the transistor drain.

In the scheme of FIG. 13A the LO frequency is determined by the delay of drift region 44 of transistor 84. In the scheme of FIG. 13B the LO frequency is determined by the delay of drift region 44, plus the delay of the external time-delay element placed in the feedback path.

In the examples of FIGS. 13A and 13B, the mixers perform down-conversion (from RF to VF or IF). Alternatively, the mixers of FIGS. 13A and 13B can be configured to perform up-conversion (from VF or IF to RF) by applying the VF or IF signal to the gate.

Further alternatively, any of the oscillator designs described above can be used to implement a mixer having a self-contained LO.

FIG. 14 is a schematic circuit diagram of a differential transistor VCO operating as a mixer, comprising a pair of transistors 84 that employ charge-carrier mobility modulation, in accordance with an embodiment that are described herein. In this example, a differential RF signal is applied to the gates of transistors 84. The transistor pair is configured to operate as a VCO (see FIG. 7B above).

By operating above fT, the disclosed techniques enable mixing and/or multiplying higher frequency signals (e.g., LO and RF signals) for a given process node, or using simpler process nodes for a given desired frequency.

FIG. 15 is a schematic circuit diagram of a Low-Noise Amplifier (LNA) or Trans-Impedance Amplifier (TIA), comprising a transistor that employs charge-carrier mobility modulation, in accordance with an embodiment that is described herein. Gain control is implemented by applying a gain control voltage Vgcl to the modulation terminal of transistor 84. In various embodiments, any suitable LNA or TIA configuration, e.g., common source or cascode, can be used. A differential amplifier may also be implemented using this configuration. The body of transistor 84 can be connected to ground or to the source.

Figure 16:
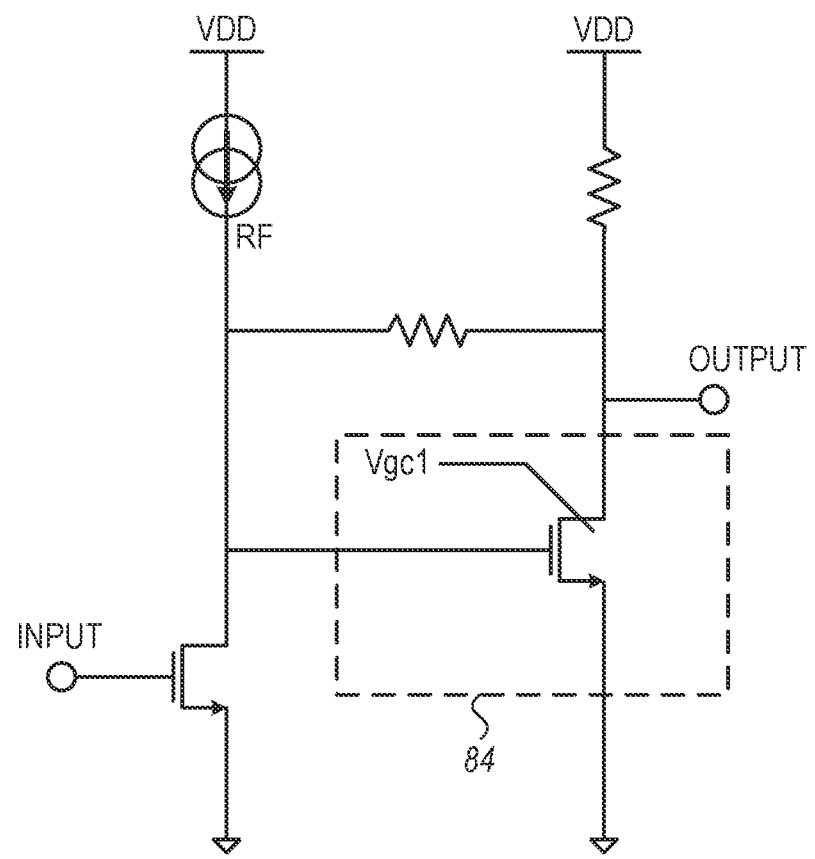
FIG. 16 is a schematic circuit diagram of a Cherry-Hooper LNA, comprising a transistor that employs charge-carrier mobility modulation, in accordance with an embodiment that is described herein.

FIG. 16 is a schematic circuit diagram of a Cherry-Hooper LNA or TIA, comprising a transistor 84 that employs charge-carrier mobility modulation, in accordance with an embodiment that is described herein. In this embodiment, too, gain control is implemented by applying a gain control voltage Vgcl to the modulation terminal of transistor 84. Any suitable LNA configuration, e.g., common source or cascode, can be used. A differential amplifier may also be implemented using this configuration. The body of transistor 84 can be connected to ground or to the source.

The Cherry Hooper amplifier of FIG. 16 can be used for implementing an integrated LNA/Mixer. In an embodiment, the integrated LNA/Mixer has a linear feedback around a switching transistor. In this embodiment, a LO signal would be applied to the modulation terminal.

The circuit components described above are depicted solely by way of example. In alternative embodiments, the disclosed transistor configurations can be used in any other suitable way to implement any other suitable circuit component.

Although the embodiments described herein mainly address transistor configurations and example use-cases of these transistors as building blocks for transceivers and other devices, the methods and systems described herein can also be used in other applications, such as in Analog to Digital Converters (ADCs), Digital-to-Analog Converters (DACs), power converter controllers (DC-DC, AC-DC, AC-AC), analog-digital mixed-mode circuits, special function circuits, digital flip-flops, latches, registers, clock circuitries, Delay-Locked Loops (DLLs), clocked and latching comparators, and many others.

Although the embodiments described herein mainly address three-terminal components such as transistors, the disclosed techniques can also be used for implementing two-terminal components such as diodes. In an example embodiment, an elongated drift region and a modulation electrode are added to the cathode of a diode, to allow modulation in forward bias operation. By applying a modulation signal to the modulation electrode, the diode forward current can be modulated at frequencies higher than 1/transit_time of the diode. A diode of this sort can also be used as a mixer, e.g., with an RE signal applied across the diode, and an LO signal applied to the modulation electrode. Such diodes can be used, for example, in diode ring mixers. Example use-cases include AGC mixers, envelope modulation, pilot tone injection, and various others.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A network device comprising:
one or more sub-circuits including one or more of (i) an oscillator, (ii) an amplifier, (iii) a mixer, and (iv) a multiplier, the one or more sub-circuits comprising one or more circuit components, the one or more circuit components comprising:
a semiconductor substrate;
a first device terminal and a second device terminal, both device terminals coupled to the semiconductor substrate, the second device terminal being spatially separated from the first device terminal;
a drift region disposed on the semiconductor substrate between the first device terminal and the second device terminal, the drift region configured to allow a flow of charge-carriers between the first device terminal and the second device terminal; and
a mobility modulator coupled to the drift region, the mobility modulator configured to selectively apply a field across the drift region responsive to one or more modulation signals, so as to modulate a mobility of charge-carriers as a function of longitudinal position along the drift region.

2. The network device according to claim 1, further comprising one or more modulation terminals configured to supply the one or more modulation signals to the mobility modulator, the one or more modulation terminals being separate from the first device terminal and the second device terminal.

3. The network device according to claim 1, wherein the mobility modulator is configured to modulate the mobility of the charge-carriers at two or more spatially different positions along the drift region.

4. The network device according to claim 1, wherein, in modulating the mobility, the mobility modulator is configured to set the mobility to first and second different mobilities at respective first and second different positions along the drift region.

5. The network device according to claim 1, wherein the mobility modulator is configured to modulate the mobility of the charge-carriers by selectively applying one or both of an electric field and a magnetic field to at least part of the drift region.

6. The network device according to claim 1, further comprising an interface region coupled to the drift region, wherein the mobility modulator is configured to modulate the mobility of the charge-carriers by causing a scattering of some charge-carriers that impinge on the interface region.

7. The network device according to claim 1, wherein the mobility modulator comprises at least one electrode coupled to the drift region, the at least one electrode configured to modulate the mobility by applying at least one electric field to at least one section of the drift region responsively to the one or more modulation signals.

8. The network device according to claim 1, wherein the mobility modulator comprises a transmission line coupled to the drift region, the transmission line being configured to modulate the mobility by applying an electromagnetic field to the drift region responsively to the one or more modulation signals.

9. The network device according to claim 1, wherein the one or more modulation signals comprise a periodic modulation signal, and wherein the mobility modulator is configured to modulate the mobility of the charge-carriers in accordance with multiple cycles of the periodic modulation signal along the drift region.

10. The network device according to claim 1, wherein the mobility modulator is configured to modulate the mobility of the charge-carriers in accordance with a non-periodic modulation signal.

11. The network device according to claim 1, wherein the first device terminal is a gate, and the second device terminal is a drain.

12. The network device according to claim 1, wherein the first device terminal is a base, and the second device terminal is a collector.

13. A method, comprising:
in a circuit component in a network device, the circuit component disposed in one or more sub-circuits of the network device, the one or more sub-circuits comprising one or more of (i) an oscillator, (ii) an amplifier, (iii) a mixer, and (iv) a multiplier, the circuit component including (i) a first device terminal and a second device terminal, both device terminals coupled to a semiconductor substrate, the second device terminal being spatially separated from the first device terminal, (ii) a drift region disposed on the semiconductor substrate between the first device terminal and the second device terminal, and (iii) a mobility modulator coupled to the drift region, allowing a flow of charge-carriers along the drift region between the first device terminal and the second device terminal; and
modulating a mobility of the charge-carriers as a function of longitudinal position along the drift region, by selectively applying a field across the drift region using the mobility modulator responsive to one or more modulation signals.

14. The method according to claim 13, wherein modulating the mobility of the charge-carriers is performed at two or more spatially different positions along the drift region.

15. The method according to claim 13, wherein modulating the mobility of the charge-carriers comprises setting the mobility to first and second different mobilities at respective first and second different positions along the drift region.

16. The method according to claim 13, wherein modulating the mobility of the charge-carriers comprises selectively applying one or both of an electric field and a magnetic field to at least part of the drift region.

17. The method according to claim 13, wherein modulating the mobility of the charge-carriers comprises causing a scattering of some charge-carriers that impinge on an interface region coupled to the drift region.

18. The method according to claim 13, wherein modulating the mobility of the charge-carriers comprises applying an electromagnetic field to the drift region, by a transmission line, responsively to the one or more modulation signals.

19. The method according to claim 13, wherein modulating the mobility of the charge-carriers comprises modulating the mobility of the charge-carriers in accordance with multiple cycles of a periodic modulation signal along the drift region.

20. The method according to claim 13, wherein modulating the mobility of the charge-carriers comprises modulating the mobility of the charge-carriers in accordance with a non-periodic modulation signal.

21. A network device including one or more circuit components, the one or more circuit components comprising:
a semiconductor substrate;
a first device terminal and a second device terminal, both device terminals coupled to the semiconductor substrate, the second device terminal being spatially separated from the first device terminal;

a drift region disposed on the semiconductor substrate between the first device terminal and the second device terminal, the drift region configured to allow a flow of charge-carriers between the first device terminal and the second device terminal; and a mobility modulator coupled to the drift region, the mobility modulator configured to selectively apply a field across the drift region responsive to a periodic modulation signal, so as to modulate a mobility of charge-carriers in accordance with multiple cycles of the periodic modulation signal along the drift region.

22. A method, comprising:

in a circuit component in a network device, the circuit component including (i) a first device terminal and a second device terminal, both device terminals coupled to a semiconductor substrate, the second device terminal being spatially separated from the first device terminal, (ii) a drift region disposed on the semiconductor substrate between the first device terminal and the second device terminal, and (iii) a mobility modulator coupled to the drift region, allowing a flow of charge-carriers along the drift region between the first device terminal and the second device terminal; and using the mobility modulator, selectively applying a field across the drift region responsive to a periodic modulation signal, so as to modulate a mobility of the charge-carriers in accordance with multiple cycles of the periodic modulation signal along the drift region.

* * * * *